(12) United States Patent
Gardner et al.

(10) Patent No.: US 6,207,520 B1
(45) Date of Patent: *Mar. 27, 2001

(54) RAPID THERMAL ANNEAL WITH A GASEOUS DOPANT SPECIES FOR FORMATION OF LIGHTLY DOPED REGIONS

(75) Inventors: Mark I. Gardner, Cedar Creek; H. Jim Fulford, Austin, both of TX (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/993,918

(22) Filed: Dec. 18, 1997

(51) Int. Cl.[7] .................................................. H01L 21/336
(52) U.S. Cl. .......................... 438/308; 438/301; 438/303; 438/305
(58) Field of Search ...................................... 438/514, 530, 438/301, 303, 305, 308

(56) References Cited

U.S. PATENT DOCUMENTS

| | | | | |
|---|---|---|---|---|
| 4,837,179 | * | 6/1989 | Foster et al. | 438/305 |
| 5,006,477 | * | 4/1991 | Farb | 438/231 |
| 5,234,850 | * | 8/1993 | Liao | 438/231 |
| 5,780,350 | * | 7/1998 | Kapoor | 438/305 |
| 5,861,335 | * | 1/1999 | Hause et al. | 438/308 |
| 6,004,852 | * | 12/1999 | Yeh et al. | 438/303 |

* cited by examiner

Primary Examiner—Carl Whitehead, Jr.
Assistant Examiner—Maria Guerrero

(57) ABSTRACT

Rapid thermal anneal with a gaseous dopant species for formation of a shallow lightly doped region is disclosed. In one embodiment of the invention, a method includes four steps. In the first step, at least one layer is applied over at least one gate over a semiconductor substrate. In the second step, an ion implantation is performed to form source and drain regions within the substrate. In the third step, the layers are removed. In the fourth step, a rapid thermal anneal with a gaseous dopant species is performed to form lightly doped regions within the substrate.

14 Claims, 4 Drawing Sheets

RAPID THERMAL ANNEAL WITH A GASEOUS DOPANT SPECIES FOR FORMATION OF LIGHTLY DOPED REGIONS

RELATED APPLICATIONS

This application is related to the co-filed and co-assigned application entitled "RAPID THERMAL ANNEAL WITH A GASEOUS DOPANT SPECIES," now U.S. Pat. No. 6,124,175, issued Sep. 26, 2000, which is hereby incorporated by reference.

FIELD OF THE INVENTION

The present invention relates generally to integrated circuit manufacturing and more particularly to rapid thermal anneal with a gaseous dopant species to form lightly doped regions within a semiconductor substrate.

BACKGROUND OF THE INVENTION

An insulated-gated field-effect transistor (IGFET), such as a metal-oxide semiconductor field-effect transistor (MOSFET), uses a gate to control an underlying surface channel joining a source and a drain. The channel, source and drain are located within a semiconductor substrate, with the source and drain being doped oppositely to the substrate. The gate is separated from the semiconductor substrate by a thin insulating layer such as a gate oxide. The operation of the IGFET involves application of an input voltage to the gate, which sets up a transverse electric field in the channel in order to modulate the longitudinal conductance of the channel.

Within a transistor, each of the source and drain meets the substrate underneath the gate at what is known as a junction. In particular, in certain types of field-effect transistors (FET's), the lightly doped source and drain regions meet the substrate underneath the gate at a junction. For example, the substrate may be p-type semiconductor material, while the lightly doped regions may be doped such that they are n-type semiconductor material. The contact between the n-type semiconductor material and the p-type semiconductor material is thus called the p-n junction.

In a p-n junction, electron holes diffuse from the p-region, where their concentration is high, to the n-region, where their concentration is low. The deficit of positively charged holes creates a layer of negatively charged acceptors in the p-region close to the junction. In a similar way, electrons diffuse from the n-region, where their concentration is high, to the p-region where their concentration is low. The deficit of negatively charged electrons creates a layer of positively charged donors in the n-region near the junction.

This charged region, nearly devoid of holes in the p-region and nearly devoid of electrons in the n-region, is called a space charge region, or a depletion region. The charges in the depletion region create a potential barrier that prevents more electrons from coming into the p-region and prevents more holes coming into the n-regions. This potential barrier exists at the p-n junction without any applied bias. The potential difference is caused by different doping of the p and n regions.

Commonly, devices such as microprocessors for personal computers include a plurality of transistors. Desirably, these transistors have shallow depletion regions, or "shallow junctions." Shallow depletion regions provide for lower potential barriers within the transistors, meaning that they may be switched on and off more quickly than transistors having higher potential barriers. Semiconductor transistors, however, typically have large or "high" depletion regions, such that their potential barriers are correspondingly high, meaning that devices in which these transistors are fabricated may not have desirable performance characteristics, especially in terms of speed (clock rate).

This undesirable performance becomes especially disadvantageous and problematic in applications where speed is of the utmost importance, such as in microprocessors. There is a need, therefore, to fabricate transistors having shallow junctions, such that their correspondingly low potential barriers result in high-performance devices incorporating the transistors.

SUMMARY OF THE INVENTION

The above-mentioned shortcomings, disadvantages and problems are addressed by the present invention, which will be understood by reading and studying the following specification. The invention relates to the rapid thermal anneal with a gaseous dopant species for formation of a shallow lightly doped region. In one embodiment, a method includes four steps. In the first step, at least one layer is applied over at least one gate over a semiconductor substrate. In the second step, an ion implantation is performed to form source and drain regions within the substrate. In the third step, the layers are removed. In the fourth step, a rapid thermal anneal with a gaseous dopant species is performed to form lightly doped regions within the substrate. Desirably, the lightly doped regions meet the substrate underneath the gate at shallow junctions. These shallow junctions allow for the fabrication of high-performance devices such as microprocessors.

In a further embodiment of the invention, where there are two gates (a first gate and a second gate), prior to the performance of the ion implantation, a first mask is deposited over the first gate. The mask is desirably an oxide mask. The rapid thermal anneal is performed with a negatively charged gaseous species, such as arsenic. After this rapid thermal anneal, the first mask is removed, and a second mask is deposited over the second gate. The second mask is also desirably oxide. A second ion implantation is performed, the at least one layer is removed from the first gate, and a second rapid thermal anneal is performed, this time with a positively charged gaseous species, such as boron. The second mask is then removed. The resulting structure thus includes a NMOSFET (the second gate with source and drain regions that are N-doped) and a PMOSFET (the first gate with source and drain regions that are P-doped).

The present invention describes methods, devices, and computerized systems of varying scope. In addition to the aspects and advantages of the present invention described here, further aspects and advantages of the invention will become apparent by reference to the drawings and by reading the detailed description that follows.

DETAILED DESCRIPTION OF THE INVENTION

In the following detailed description of exemplary embodiments of the invention, reference is made to the accompanying drawings which form a part hereof, and in which is shown by way of illustration specific exemplary embodiments in which the invention may be practiced. These embodiments are described in sufficient detail to enable those skilled in the art to practice the invention, and it is to be understood that other embodiments may be utilized and that logical, mechanical, electrical and other changes may be made without departing from the spirit or scope of the present invention. The following detailed description is, therefore, not to be taken in a limiting sense, and the scope of the present invention is defined only by the appended claims.

Figure 1A:
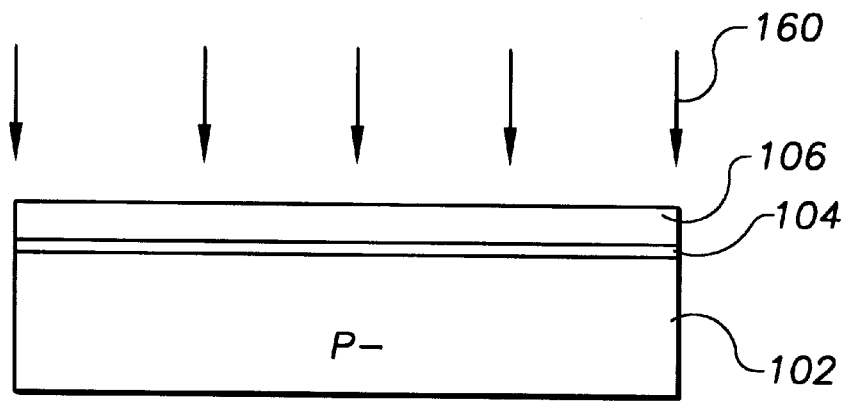
FIGS. 1A–1E show cross-sectional views of successive process steps for making an IGFET in accordance with one embodiment of the invention.

Described first is an IGFET. In FIG. 1A, silicon substrate 102 suitable for integrated circuit manufacture includes P-type epitaxial layer with a boron background concentration on the order of $1\times10^{16}$ atoms/cm$^2$, a <100> orientation and a resistivity of 12 ohm-cm. Desirably, the epitaxial surface layer is disposed on a P+ base layer, not shown, and includes a planar top surface. Gate oxide 104, comprise of silicon dioxide, is formed on the top surface of substrate 102 using oxide tube growth at a temperature of 700E to 1000E C., in an O$_2$ containing ambient. A typical oxidation tube contains several sets of electronically powered heating coils surrounding the tube, which is either quartz, silicon carbide, or silicon, desirably. In O$_2$ gas oxidation, the wafers are placed in the tube in a quartz boat or elephant trunk like, and the gas flow is directed across the wafer surfaces to the opposite or exhaust end of the tube. Gate oxide 104 has a thickness of 30 angstroms, desirably.

Thereafter, a blanket layer of undoped polysilicon 106 is deposited by low pressure chemical vapor deposition (LPCVD) on the top surface of gate oxide 104. Polysilicon 106 has a thickness of 2000 angstroms, desirably. If also desired, polysilicon 106 can be doped in situ as deposition occurs, or doped before a subsequent etch step by implanting arsenic with a dosage in the range of $5\times10^{14}$ to $5\times10^{15}$ atoms/cm$^2$, and an energy in the range of 2 to 80 keV. However, it is generally desired that polysilicon 106 be doped during an implantation step following a subsequent etch step.

In FIG. 1A, the polysilicon 106 deposited on the substrate 102 is implanted with arsenic ions and then with nitrogen ions, as depicted by arrows 160. The arsenic ions enhance the rate of silicon dioxide growth in subsequent oxidation processes used to add or grow an additional layer of silicon dioxide. The arsenic ion implant has a dosage in the range of $5\times10^{14}$ to $5\times10^{15}$ atoms/cm$^2$, and an energy level ranging between about 2 to 80 keV. Doping with nitrogen is optional. The arrows 160 depict either the single step of doping with arsenic ions, or the two steps of doping with arsenic and then doping with nitrogen ions. The nitrogen ions may be added to retard the diffusion of the arsenic atoms. If the polysilicon is to be doped with nitrogen ions, the polysilicon may be implanted at this point in the process at a dosage of $5\times10^{14}$ to $5\times10^{15}$ atoms/cm$^2$, and at an energy level of 20 to 200 keV. Nitrogen ions may be implanting after etching the polysilicon.

Figure 1B:
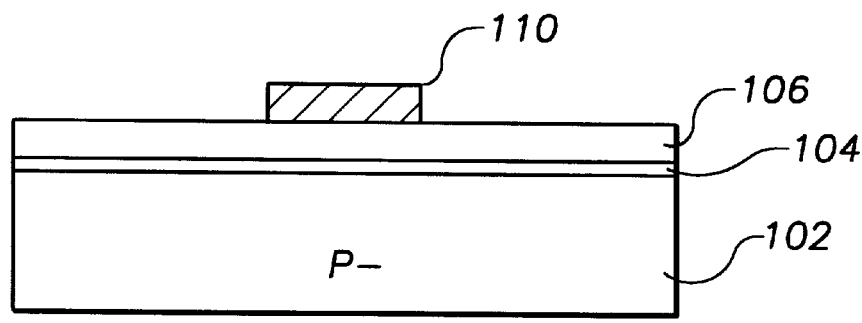

In FIG. 1B, photoresist 110 is deposited as a continuous layer on polysilicon 106 and selectively irradiated using a photolithographic system, such as a step and repeat optical projection system, in which I-line ultraviolet light from a mercury-vapor lamp is projected through a first reticle and a focusing lens to obtain a first image pattern. Thereafter, the photoresist 110 is developed and the irradiated portions of the photoresist are removed to provide openings in photoresist 110. The openings expose portions of polysilicon 106, thereby defining a gate.

Figure 1C:
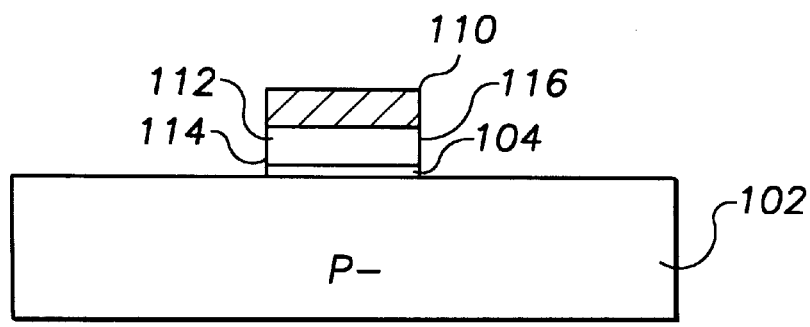

In FIG. 1C, an anisotropic etch is applied that removes the exposed portions of polysilicon 106 and the underlying portions of gate oxide 104. Desirably, a first dry etch is applied that is highly selective of polysilicon, and a second dry etch is applied that is highly selective of silicon dioxide, using photoresist 110 as an etch mask. After etching occurs, the remaining portion of polysilicon 106 provides polysilicon gate 112 with opposing vertical sidewalls (or, edges) 114 and 116. Polysilicon gate 112 has a length (between sidewalls 114 and 116) of 3500 angstroms, desirably.

Figure 1D:
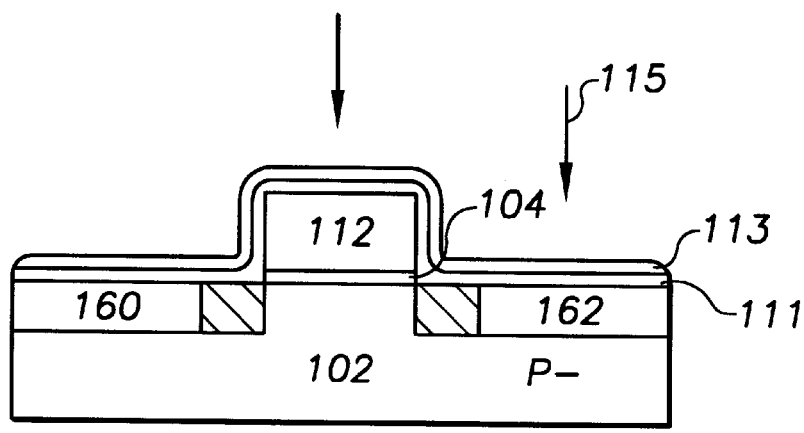

In FIG. 1D, photoresist 110 is stripped, and oxide layer 111 and nitride layer 113 are formed. Oxide layer 111, comprised of silicon dioxide, is formed desirably using oxide tube growth at a temperature of 700E to 1000E C., in an O$_2$ containing ambient. A typical oxidation tube contains several sets of electronically powered heating coils surrounding the tube, which is either quartz, silicon carbide, or silicon, desirably. Nitride layer 113 is formed desirably by doping the oxide layer 111 with nitrogen ions, such as by ion implantation. Nitride layer 113 is desirably 100 angstroms in thickness, and oxide layer 111 is desirably 50 angstroms in thickness.

Also in FIG. 1D, an ion implantation, as represented by arrows 115, is performed to form source and drain regions 160 and 162. Source and drain regions 160 and 162 extend within substrate 102 except as masked by gate 112, and those portions of layers 111 and 113 that have formed on the sidewalls of gate 112. Thus, these portions of layers 111 and 113 act as spacers, preventing source and drain regions 160 and 162 from forming within the substrate 102 immediately adjacent to gate 112. The ion implantation may be positively or negatively charged, and common dopants include boron and arsenic. The ion implantation is shown in FIG. 1D by arrows 115.

Figure 1E:
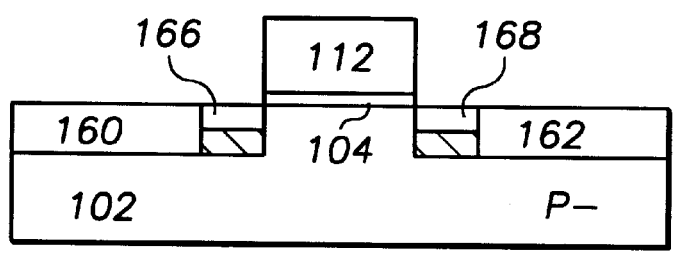

In FIG. 1E, lightly doped regions 166 and 168 are formed by a rapid thermal anneal with a gaseous dopant species. The rapid thermal anneal thus is used to transmit the gaseous dopant species within substrate 102 to create regions 166 and 168. The rapid thermal anneal is desirably performed at 800 to 1000 degrees Celsius, for about ten to sixty seconds. The gaseous dopant species may be negatively charged, if an NMOSFET is desired, or positively charged, if a PMOSFET is desired. Such dopant species include arsenic (negatively charged), and boron (positively charged).

The regions 166 and 168 abut semiconductor substrate 102 underneath the gate 112 at a shallow junction, such that the resulting device created in FIGS. 1A–1E has desirable high-performance characteristics. Not shown in FIG. 1E are the conventional processing steps of metal salicidation, placing glass over the surface, and forming a contact opening for subsequently placed connectors. A passivation layer may also then be deposited as a top surface. Additionally, the principal processing steps disclosed herein may be combined with other steps apparent and known to those skilled in the art.

A more complicated structure, having both a NMOSFET and a PMOSFET, may be constructed following the processing steps of FIGS. 2A–2F. Those of ordinary skill within the art will appreciate that the description of these processing steps relies upon knowledge of the processing steps of FIGS. 1A–1E already described, such that only those steps needed to describe to one of ordinary skill in the art how to make and use the embodiment resulting from FIGS. 2A–2F are described.

Figure 2A:
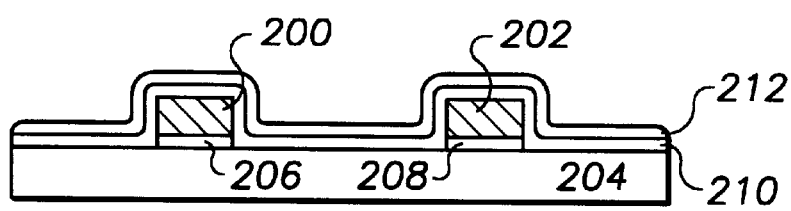
FIGS. 2A–2F show cross-sectional views of successive process steps for making an NMOSFET and a PMOSFET, in conjunction with the process of FIGs. 1A–1E, in accordance with one embodiment of the invention; and, FIG. 3 is a diagram of a computerized system, in accordance with which the invention may be implemented.

Referring first to FIG. 2A, polysilicon gates 200 and 202 are formed on silicon substrate 204. Gate 200 has gate oxide 206 between the gate and substrate 204, while gate 202 has gate oxide 208 between the gate and substrate 204. On top of gates 200 and 202, and the exposed region of substrate 204 (i.e., those areas of substrate 204 not masked by gates 200 and 202) is placed an oxide layer 210 and a nitride layer 212. Gates 200 and 202, gate oxides 206 and 208, and layers 210 and 212 may be performed substantially as has been described in conjunction with FIGS. 1A–1D, as those of ordinary skill within the art can appreciate.

Figure 2B:
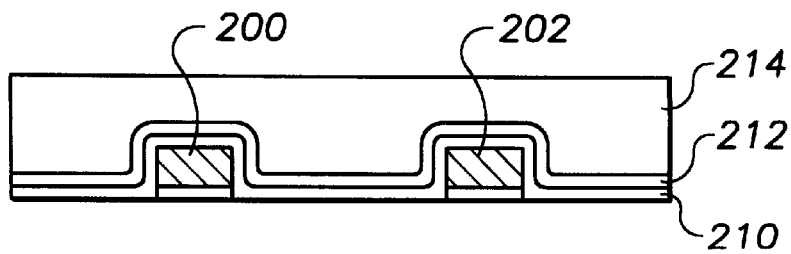

In FIG. 2B, an oxide mask 214 is deposited over gates 200 and 202, and their overlaying layers 210 and 212. The invention is not limited to the manner by which the oxide is deposited as mask 214.

Figure 2C:
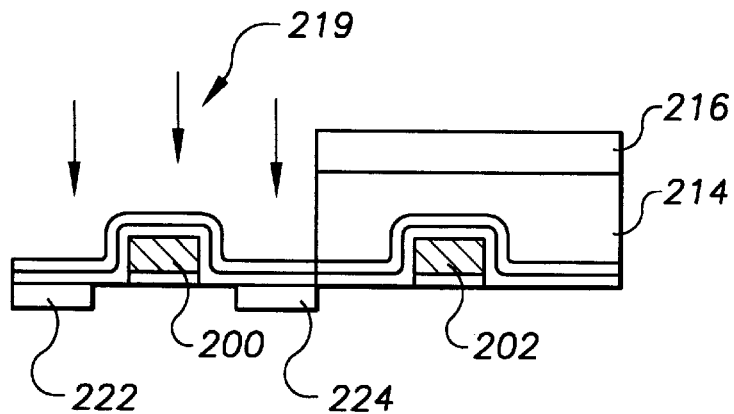

In FIG. 2C, photoresist 216 is deposited as a continuous layer on oxide mask 216 and selectively irradiated. Thereafter, the photoresist 216 is developed and the irradiated portions of the photoresist are removed to provide openings in photoresist 216 such that only gate 202 is covered by photoresist. An etchant is then applied that removes the exposed portions of oxide mask 216. Also in FIG. 2C, an ion implantation is applied, to create source and drain regions 222 and 224. The dopant is negatively charged so that an NMOSFET is created (e.g., such as arsenic). The ion implantation is shown in FIG. 2C by arrows 219.

Figure 2D:
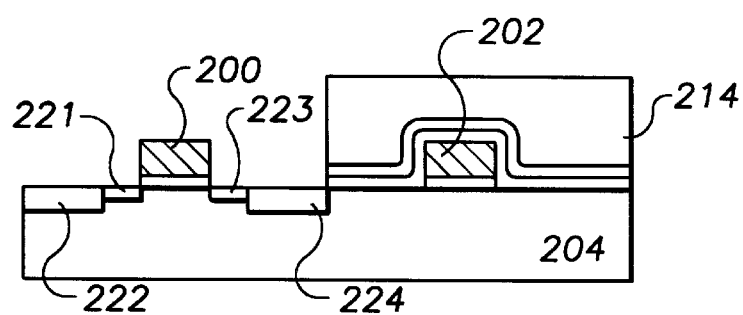

In FIG. 2D, photoresist 216 is stripped, and lightly doped regions 221 and 223 are formed by a rapid thermal anneal with a negatively charged gaseous dopant species. The rapid thermal anneal is desirably performed at 800 to 1000 degrees Celsius, for about ten to sixty seconds. The gaseous dopant species is negatively charged so that an NMOSFET is created. Such dopant species include arsenic. The regions 221 and 223 abut semiconductor substrate 202 underneath the gate 200 at a shallow junction, such that the resulting device has desirable high-performance characteristics.

Figure 2E:
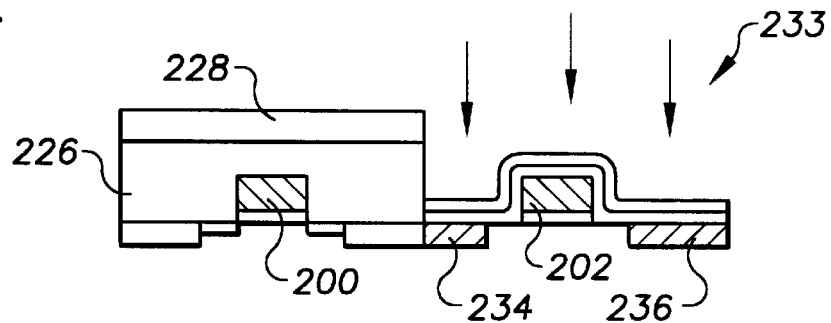

In FIG. 2E, another oxide mask 226 is deposited over gate 200. Photoresist 228 is deposited as a continuous layer on oxide mask 214 and 226 and selectively irradiated. Thereafter, the photoresist 228 is developed and the irradiated portions of the photoresist are removed to provide openings in photoresist 228 such that only gate 200 is covered by photoresist. An etchant is then applied that removes oxide mask 214. Also in FIG. 2E, an ion implantation is applied, to create source and drain regions 234 and 236. The dopant is positively charged so that a PMOSFET is created (e.g., such as boron). The ion implantation is shown in FIG. 2E by arrows 233.

Figure 2F:
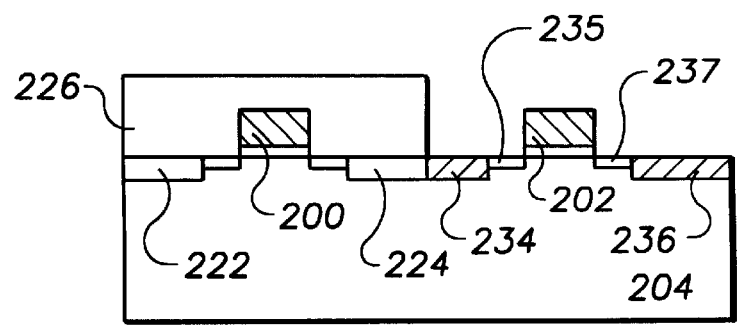

In FIG. 2F, lightly doped regions 234 and 236 are formed by a rapid thermal anneal with a positively charged gaseous dopant species. The rapid thermal anneal is desirably performed at 800 to 1000 degrees Celsius, for about ten to sixty seconds. The gaseous dopant species is positively charged so that a PMOSFET is created. Such dopant species include boron. The regions 234 and 236 abut semiconductor substrate 204 underneath the gate 202 at a shallow junction, such that the resulting device desirable high-performance characteristics. Therefore, the result of steps FIGS. 2A–2F is a CMOS device, including both an NMOS and a PMOS device.

Figure 3:
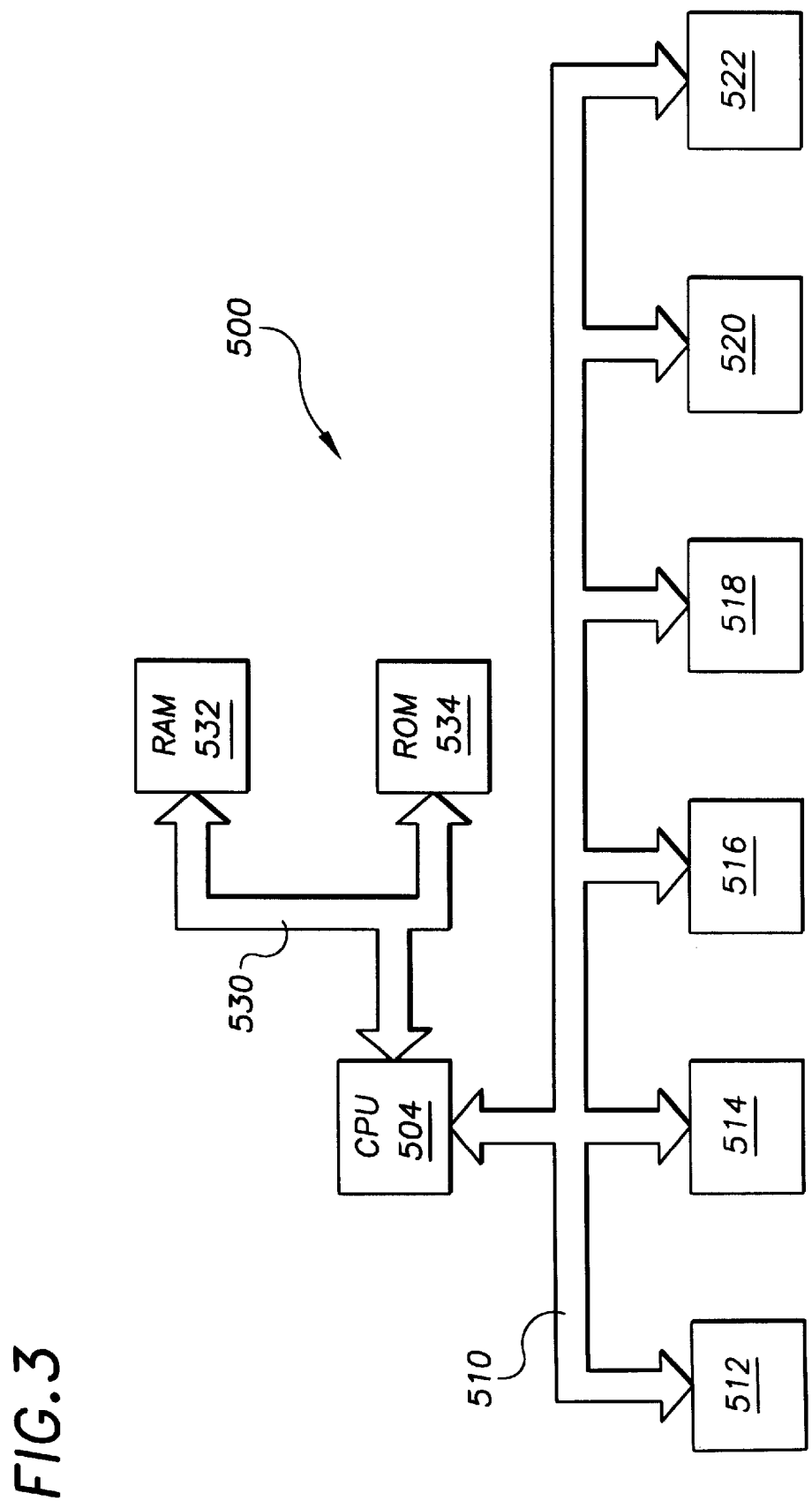

Referring next to FIG. 3, advantageously the invention is well-suited for use in a device such as an integrated circuit chip, as well as an electronic system including a central processing unit, a memory and a system bus. The electronic system may be a computerized system 500 as shown in FIG. 3. The system 500 includes a central processing unit 500, a random access memory 532, and a system bus 530 for communicatively coupling the central processing unit 504 and the random access memory 532. The system 500 includes a device formed by the steps shown in and described in conjunction with FIGS. 1A–1G. The system 500 may also include an input/output bus 510 and several peripheral devices, such as devices 512, 514, 516, 518, 520 and 522, which may be attached to the input/output bus 510. Peripheral devices may include hard disk drives, floppy disk drives, monitors, keyboards, and other such peripherals.

Rapid thermal annealing with a gaseous dopant species to form lightly doped regions has been described. Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention. Therefore, it is manifestly intended that this invention be limited only by the following claims and equivalents thereof.

We claim:

1. A method for forming a device comprising:
    applying at least one layer over at least one gate over a semiconductor substrate;
    depositing a first mask over the at least one gate and forming spacers from the first mask along either side of said at least one gate;
    performing an ion implantation to form source and drain regions within the substrate while using the spacers to prevent ion implantation within the substrate immediately adjacent the at least one gate;
    removing the at least one layer.
    performing a rapid thermal anneal with a charged gaseous dopant species to form lightly doped regions within the substrate; and subsequent to performing the rapid thermal anneal, removing the first mask from the first gate, and depositing a second mask over the second gate.

2. The method of claim 1, wherein the first mask comprises an oxide mask.

3. The method of claim 1, wherein the second mask comprises an oxide mask.

4. The method of claim 1, wherein the lightly doped regions meet the substrate underneath the gate at shallow junctions.

5. The method of claim 1, wherein the rapid thermal anneal is performed at a temperature within the range of 800 to 1000 degrees Celsius.

6. The method of claim 1, wherein the rapid thermal anneal is performed for ten to sixty seconds.

7. The method of claim 1, wherein the charged gaseous dopant species is negatively charged.

8. The method of claim 1, wherein the charged gaseous dopant species is arsenic.

9. The method of claim 1, wherein the charged gaseous dopant species includes arsenic.

10. The method of claim 1, further comprising, subsequent to depositing the second mask, performing a second ion implantation to form additional source and drain regions within the substrate;

removing the at least one layer from the first gate; and, performing a second rapid thermal anneal with a second gaseous dopant species to form additional lightly doped regions within the substrate.

11. The method of claim 1, wherein the charged gaseous dopant species is positively charged.

12. The method of claim 10, wherein the second gaseous dopant species comprises boron gas to form the additional lightly doped regions.

13. The method of claim 11, wherein the positively charged gaseous dopant species is boron.

14. The method of claim 11 wherein the positively charged gaseous dopant species includes boron.

* * * * *

UNITED STATES PATENT AND TRADEMARK OFFICE
CERTIFICATE OF CORRECTION

PATENT NO. : 6,207,520 B1
DATED : March 27, 2001
INVENTOR(S) : Gardner et al.

It is certified that error appears in the above-identified patent and that said Letters Patent is hereby corrected as shown below:

Column 3,
Line 28, "P-type epitaxial" should read -- a P-type epitaxial --.
Line 32, "comprise of" should read -- comprised of --.

Column 4,
Line 6, "ions may be implanting" should read -- ions may be implanted --.

Column 6,
Line 54, "least one gate over" should read -- at least one of a first gate and a second gate, over --.

Signed and Sealed this

Twenty-fourth Day of December, 2002

JAMES E. ROGAN
*Director of the United States Patent and Trademark Office*